(12) United States Patent
Leija et al.

(10) Patent No.: US 7,299,639 B2
(45) Date of Patent: Nov. 27, 2007

(54) THERMOELECTRIC MODULE

(75) Inventors: Javier Leija, Chandler, AZ (US); Christopher D. Lucero, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 135 days.

(21) Appl. No.: 10/874,525

(22) Filed: Jun. 22, 2004

(65) Prior Publication Data

US 2005/0279104 A1    Dec. 22, 2005

(51) Int. Cl.
   *F25B 21/02* (2006.01)
(52) U.S. Cl. ............................................. 62/3.2; 62/3.7
(58) Field of Classification Search .................. 62/3.2, 62/3.3, 3.7, 259.2
   See application file for complete search history.

(56) References Cited

U.S. PATENT DOCUMENTS

| | | | |
|---|---|---|---|
| 5,712,448 A * | 1/1998 | Vandersande et al. ...... 136/203 |
| 5,724,818 A | 3/1998 | Iwata et al. | |
| 6,262,357 B1 * | 7/2001 | Johnson et al. ............. 136/203 |
| 6,278,049 B1 * | 8/2001 | Johnson et al. ............. 136/201 |
| 6,347,521 B1 * | 2/2002 | Kadotani et al. ............. 62/3.7 |
| 6,385,976 B1 * | 5/2002 | Yamamura et al. ........... 62/3.7 |
| 6,387,565 B1 | 5/2002 | Aihara et al. | |
| 6,410,971 B1 * | 6/2002 | Otey ........................... 257/467 |
| 6,424,533 B1 | 7/2002 | Chu et al. | |
| 6,637,210 B2 * | 10/2003 | Bell .............................. 62/3.7 |
| 6,653,557 B2 * | 11/2003 | Wolf et al. .................. 174/386 |
| 6,679,064 B2 * | 1/2004 | Chang et al. .................. 62/3.3 |

FOREIGN PATENT DOCUMENTS

| | | |
|---|---|---|
| WO | WO 02/25698 A | 3/2002 |
| WO | WO 2005/111715 A | 11/2005 |

* cited by examiner

*Primary Examiner*—Melvin Jones
(74) *Attorney, Agent, or Firm*—Blakely, Sokoloff, Taylor & Zafman LLP

(57) ABSTRACT

A thermoelectric module having areas of highly thermally conductive material integrated into a substrate layer. For one embodiment copper pads are integrated into the external surface of the substrate of the hot side of the thermoelectric module. The copper pads allow direct connection of a heat removal device to the thermoelectric module thereby reducing thermal resistance. Thermal vias may be formed through the substrate to further reduce thermal resistance.

27 Claims, 8 Drawing Sheets

THERMOELECTRIC MODULE

FIELD

Embodiments of the invention relate generally to the field of thermoelectric cooling and more specifically to a more efficient thermoelectric cooling module and their applications.

BACKGROUND

A thermoelectric module (TEM) contains a number of alternating p-type and n-type semicondcutor thermoelements (e.g., n and p diodes) serially connected and disposed between two thermally conducting, but electrically insulating substrates. When an electric current is passed through the TEM, heat is absorbed at one face (one of the substrates) and rejected at the other face. The TEM thus functions as a cooler or refrigerator. A TEM may be used as a thermoelectric cooler in applications where small size, high reliability low power consumption and a wide operating temperature range are required.

FIG. 1 illustrates a typical TEM in accordance with the prior art. TEM 100, shown in FIG. 1 includes multiple n and p diode pairs 110, which are typically electrically connected in series with conductive connecting strips 115. Typically the space 111 between diode pairs 110 contains air. The diodes are disposed between two substrates 120A and 120B. Typically such substrates are formed by bonding several (e.g., three) ceramic layers together. When a current is connected through the negative terminal 125A and the positive terminal 125B, one side of the TEM (e.g., substrate 120A) will absorb heat, and the other side (e.g., substrate 120B) rejects heat. The side of the TEM that absorbs heat is referred to as the "cold side" and the side of the TEM that rejects heat is referred to as the hot side. Which side of the TEM is the cold side and which the hot side is determined by the polarity of the current. That is, reversing the current changes the direction of the heat transfer.

FIG. 1A illustrates a side view of the TEM 100.

TEMs can be used to cool a heat generating component by attaching a heat generating component to the cold side of the TEM and applying a current. TEMs can likewise be used to heat by reversing the TEM physically or reversing the current.

When used to cool a heat generating component, the TEM will not function efficiently unless a heat removal device is attached to the hot side. This is because the TEM is designed to maintain a specified temperature difference, $\Delta T$, between the cold side of the TEM and the hot side of the TEM. As heat from the heat generating component is absorbed by the cold side, the hot side gets increasingly hot in order to maintain the temperature difference $\Delta T$. The hot side of the TEM can get so hot that the TEM fails.

To address this situation, a heat removal device (e.g., a heat sink) is attached to the hot side. Typically, a thermal interface material (TIM) is used to reduce the contact resistance between the heat removal device, which may be a copper or aluminum block with fins, and the TEM substrate. The TIM fills the voids and grooves created by the imperfect surface finish of the two surfaces. Such voids and grooves can be highly thermally resistant. The TIMs used, typically polymers or grease, are thermally conductive materials. Even with the use of TIMs, the thermal resistance at the TEM/heat removal device interface can be excessive and detrimental for some applications.

BRIEF DESCRIPTION OF THE DRAWINGS

The invention may be best understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 1:
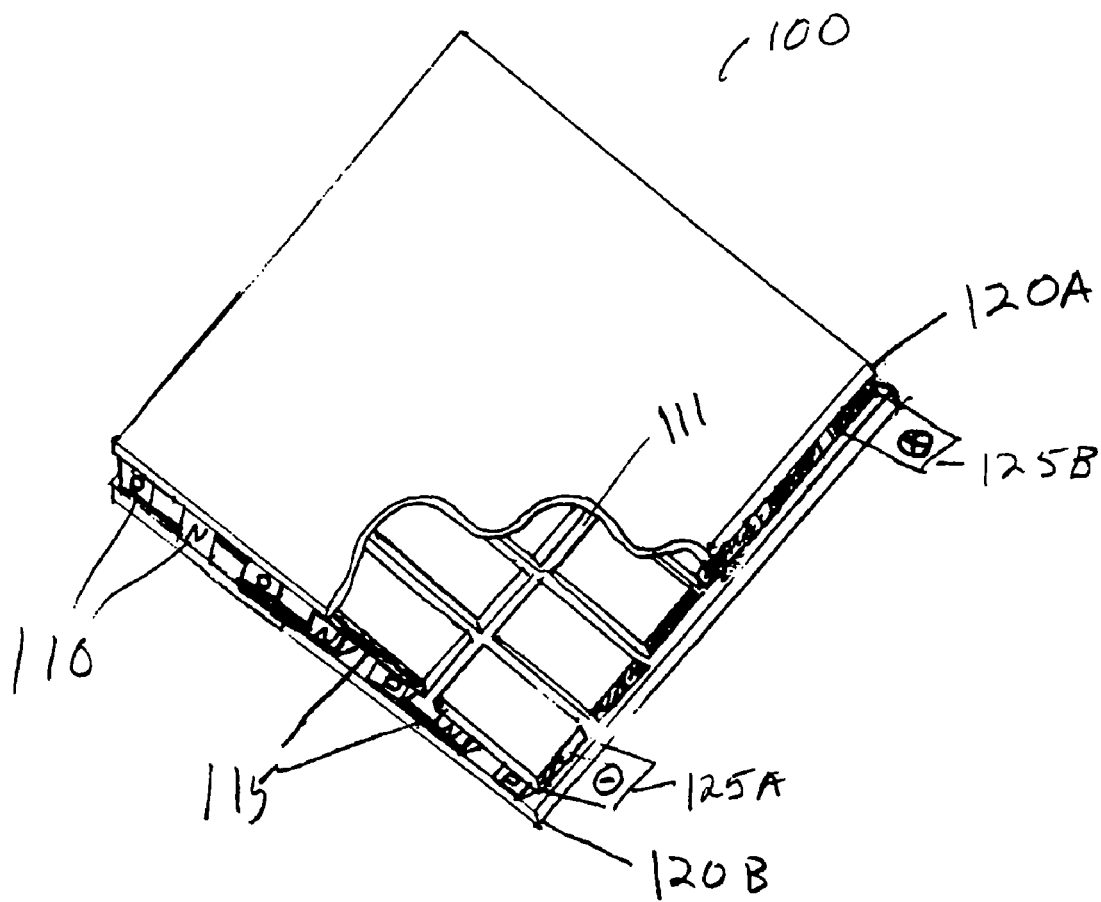
FIG. 1 illustrates a typical TEM in accordance with the prior art.
Figure 1A:
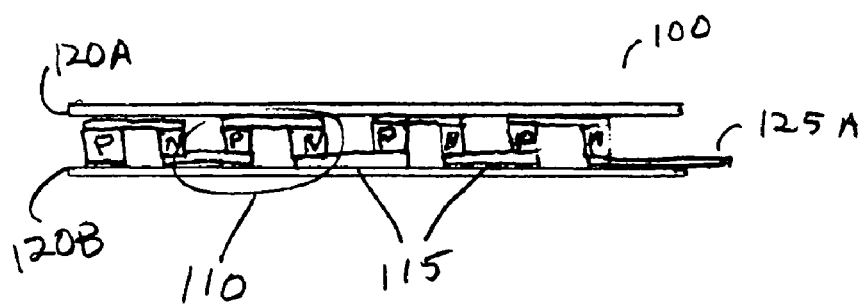
FIG. 1A illustrates a side view of the TEM in accordance with the prior art.
Figure 2:
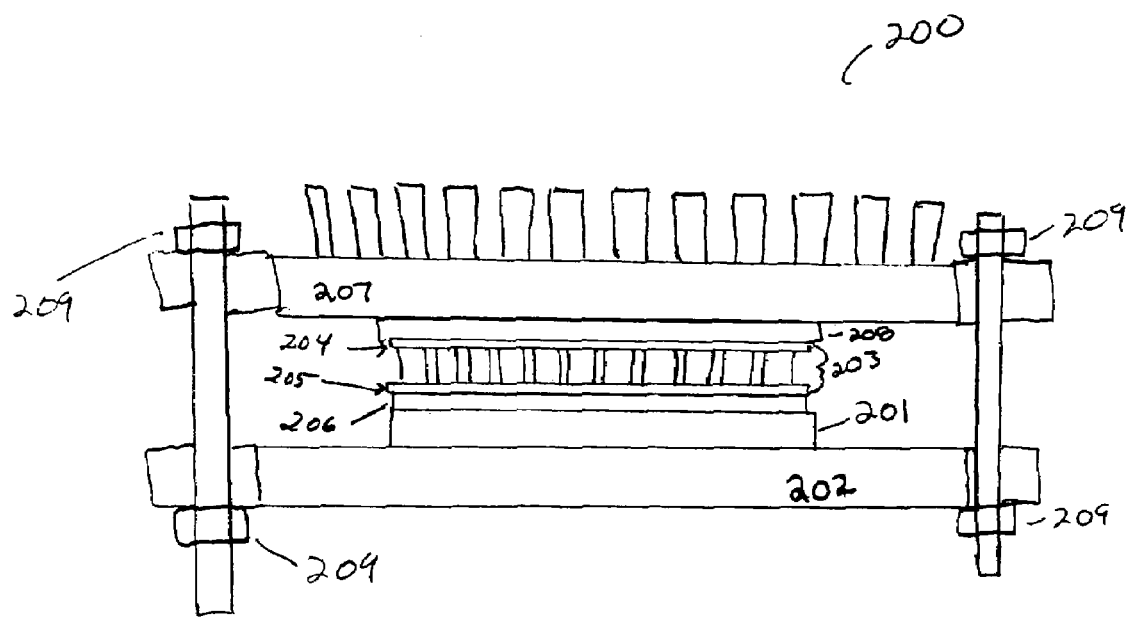
FIG. 2 illustrates the use of a TEM to cool a microelectronics device.

An embodiment of the invention may be used in the context of cooling microelectronic devices. For example, because microelectronic devices are becoming smaller with increased power requirements, the devices are producing increasing amounts of heat, which must be removed from a decreasing surface area. FIG. 2 illustrates the use of a TEM to cool a microelectronics device. TEM-cooled device 200, shown in FIG. 2, includes a device package 201 placed upon a PCB 202. Attached to the device package 201 is a TEM 203 to cool the device package 201. The TEM 203 has a hot side 204 and a cold side 205. A first TIM layer 206 is disposed between the device package 201 and the cold side 205 of TEM 203. A heat removal device 207 is attached to the hot side 204 of the TEM 203. The heat removal device may typically be a conductive metal block with fins formed thereon. A second TIM layer 208 is disposed between the hot side 204 of TEM 203 and the heat removal device 207. Mounting hardware 209 is used to ensure that adequate pressure is applied. The TIM layers and the mounting hardware provide additional thermal resistance in the overall cooling solution of the TEM-cooled device 200.

The measure of the thermal resistance can be defined as $\psi=\Delta T/pwr$, where $\Delta T$ is the difference in temperature at the die junction $T_J$ and the ambient temperature $T_A$, and pwr is the amount of power dissipated through the device in watts. A typical desired value for $\psi_{JA}$ is 0.3° C./watt. Junction temperatures are fixed by the components of the microelectronic device, and therefore, as power requirements increase for such devices, the value of $\psi_{JA}$ must decrease proportionally.

Figure 3:
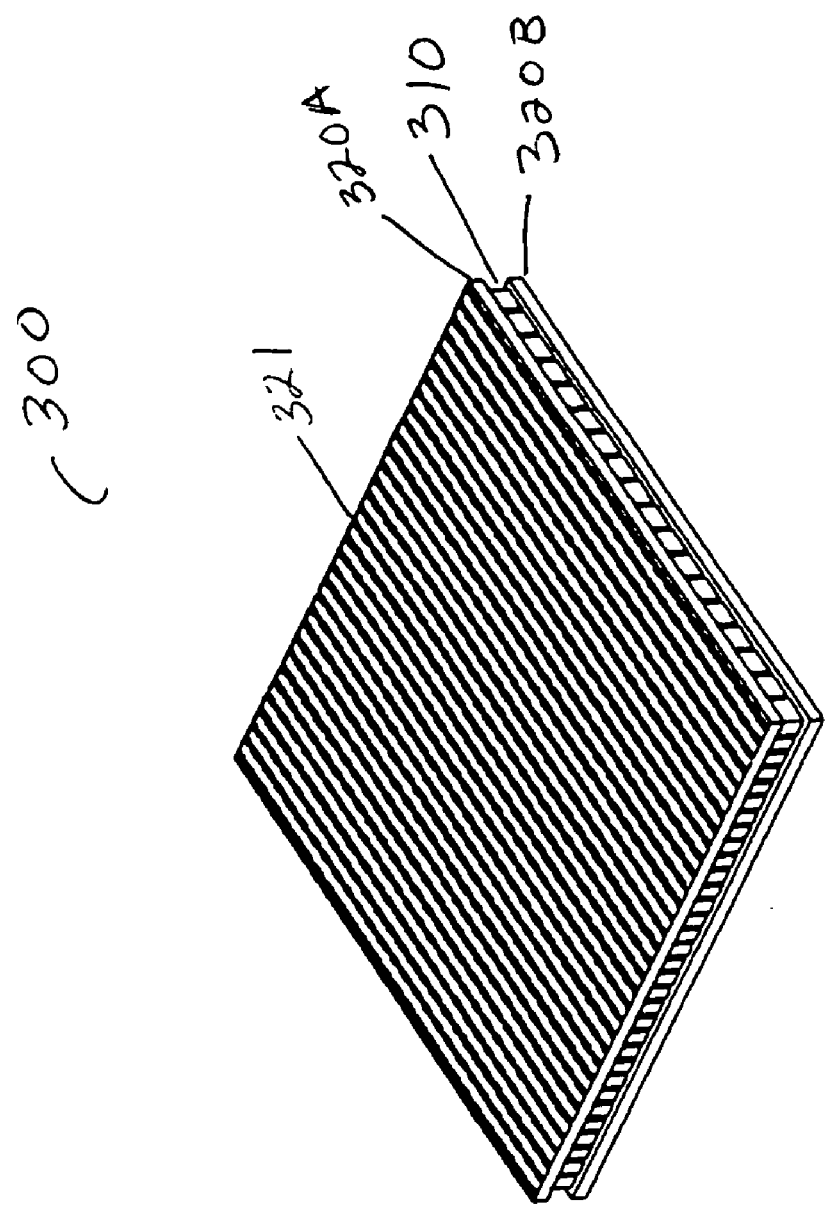
FIG. 3 illustrates a TEM having areas of highly thermally conductive material integrated into a substrate layer in accordance with one embodiment of the invention.

FIG. 3 illustrates a TEM having areas of highly thermally conductive material integrated into a substrate layer in accordance with one embodiment of the invention. For purposes of this discussion, highly thermally conductive materials are those having a thermal conductivity greater than approximately 200 W/m K at 20° C. TEM 300, shown in FIG. 3, includes multiple n and p diode pairs 310 disposed between two substrates 320A and 320B. The substrates 320A and 320B may be formed by bonding several ceramic layers together. At least one of the substrates includes areas of highly thermally conductive material integrated into the substrate surface. For example, as shown in FIG. 3, substrate 320A includes area, shown by example as areas 321 of highly thermally conductive material. For one embodiment, the highly thermally conductive material is a metal such as copper, aluminum, silver, and alloys thereof, such as copper-indium and silver zinc alloys. For example, areas 321 may comprise copper pads integrated into the top surface of a multi-layered substrate for one embodiment.

In accordance with one embodiment of the invention, integrated metal areas within the surface layer of the TEM substrate can be used to integrate a heat removal directly to the TEM. For example, metal fins can be directly soldered or brazed to the integrated metal areas within the surface layer of the TEM substrate. For such an embodiment, a TIM layer between the heat removal device and the TEM is not required, and therefore, the thermal resistance associated with the TIM layer is avoided. A typical value of the thermal resistance across the TIM layer is approximately 0.1° C./watt, and therefore, obviating the need for such a layer can significantly reduce the thermal resistance, $\psi_{JA}$, (e.g., from 0.3° C./watt to 0.2° C./watt).

Figure 4:
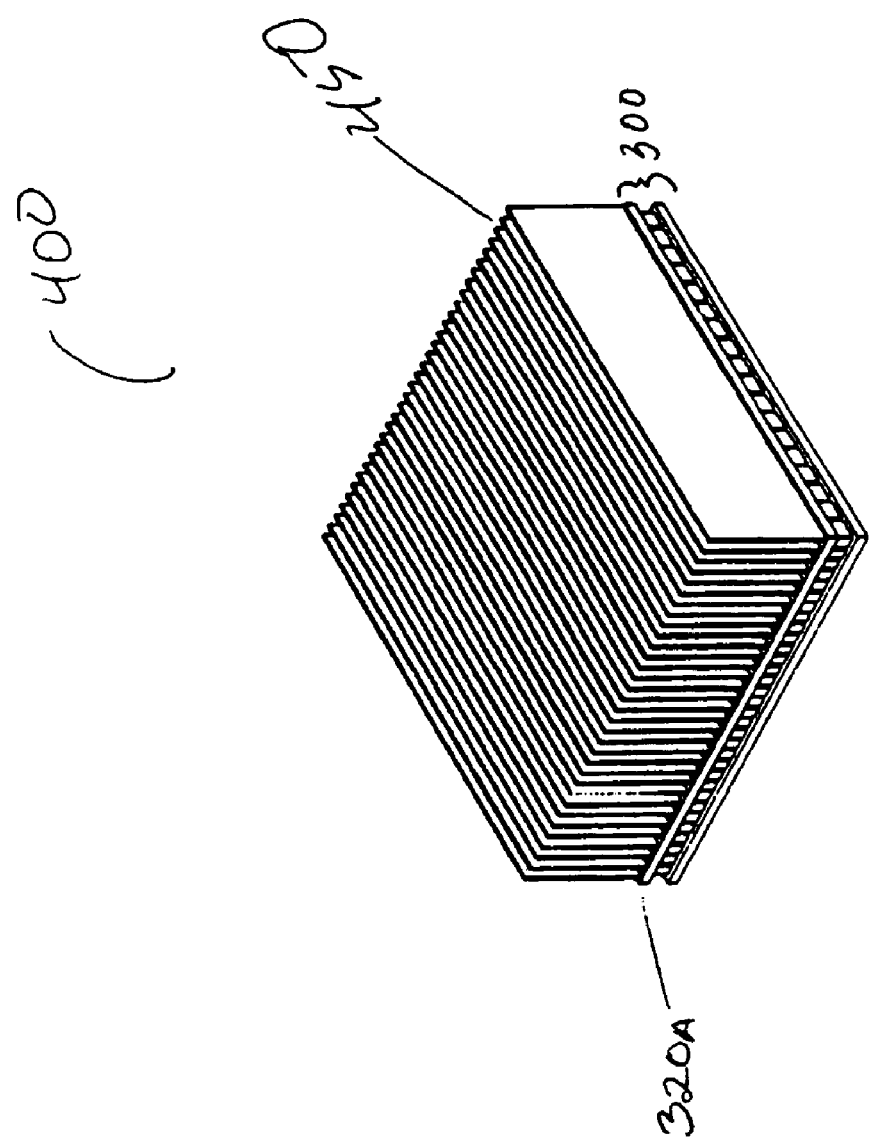
FIG. 4 illustrates a TEM having metal areas integrated within the surface layer of the substrate and a heat removal device directly integrated to the metal areas in accordance with one embodiment of the invention.

FIG. 4 illustrates a TEM having metal areas integrated within the surface layer of the substrate and a heat removal device directly integrated to the metal areas in accordance with one embodiment of the invention. TEM 400, shown in FIG. 4, includes a TEM 300 in accordance with an embodiment of the invention as described above in reference to FIG. 3. In accordance with one embodiment of the invention, a number of plate fins 450 are directly attached to the TEM 300. The plate fins 450 may be soldered or brazed to the metal areas (not shown) integrated into the surface layer of the TEM substrate 320A.

The TEM 400, having a heat removal device directly integrated to the TEM substrate, reduces thermal resistance by rendering a TIM material between the heat removal device and the TEM unnecessary. Additional thermal resistance can be avoided by providing thermal vias through the TEM substrate. For example, for one embodiment of the invention, the surface layer of the TEM substrate has highly thermally conductive areas integrated thereon and additionally, has highly thermally conductive traces formed through subsequent layers of the TEM substrate to act as thermal vias.

Figure 5:
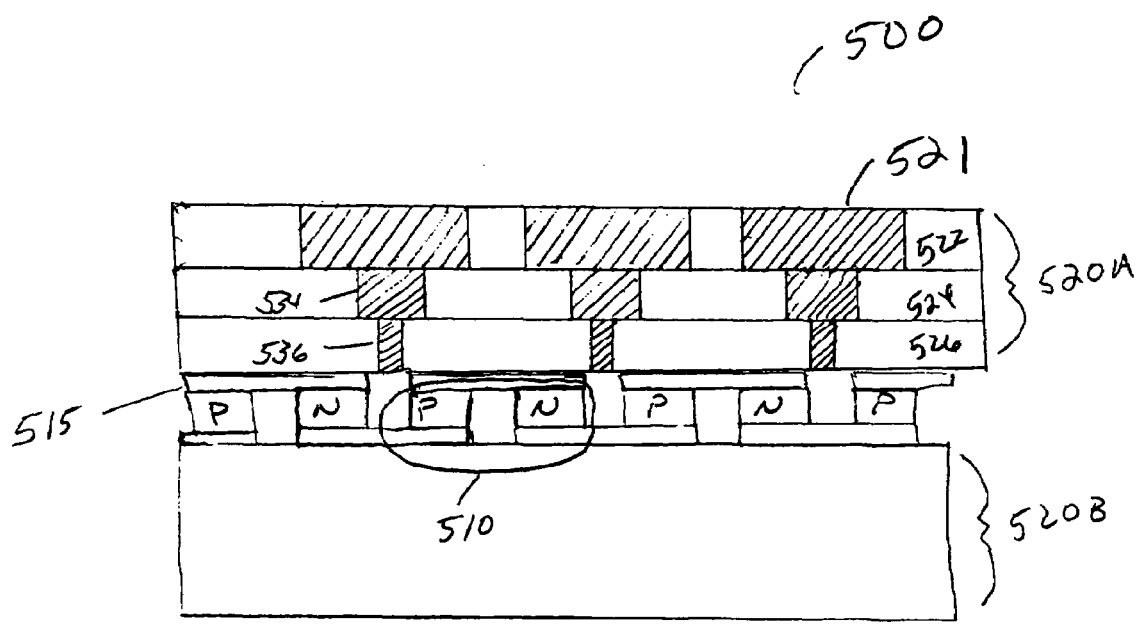
FIG. 5 illustrates a TEM having metal areas integrated within the surface layer of the substrate and metal traces formed through subsequent layers of the TEM substrate to act as thermal vias.

FIG. 5 illustrates a TEM having metal areas integrated within the surface layer of the substrate and metal traces formed through subsequent layers of the TEM substrate to act as thermal vias. TEM 500, shown in FIG. 5, has multiple n and p diode pairs 510 electrically connected with conductive connecting strips 515. The diodes are disposed between two substrates 520A and 520B. As shown in FIG. 5, substrate 520A is formed of three ceramic layers, namely, 522, 524, and 526. Surface layer 522 of substrate 520A has integrated therein, areas 521 of highly thermally conductive material such as copper or aluminum. Ceramic layers 524 and 526 have metal traces 534 and 536, respectively, integrated therein. Metal traces 534 are in contact with areas 521 and are also in contact with metal traces 536. As such, a thermal via is created through the TEM substrate 520A. The thermal vias are essentially thermally conductive pathways through the substrate, which may be metal tubes of any suitable geometry. For one embodiment, metal traces 536 have dimensions and are so positioned so as not to short the conductive connecting strips 515, while the dimensions and or position of metal traces 534 may vary. Implementation of thermal vias through the TEM substrate further reduces thermal resistance.

Figure 6:
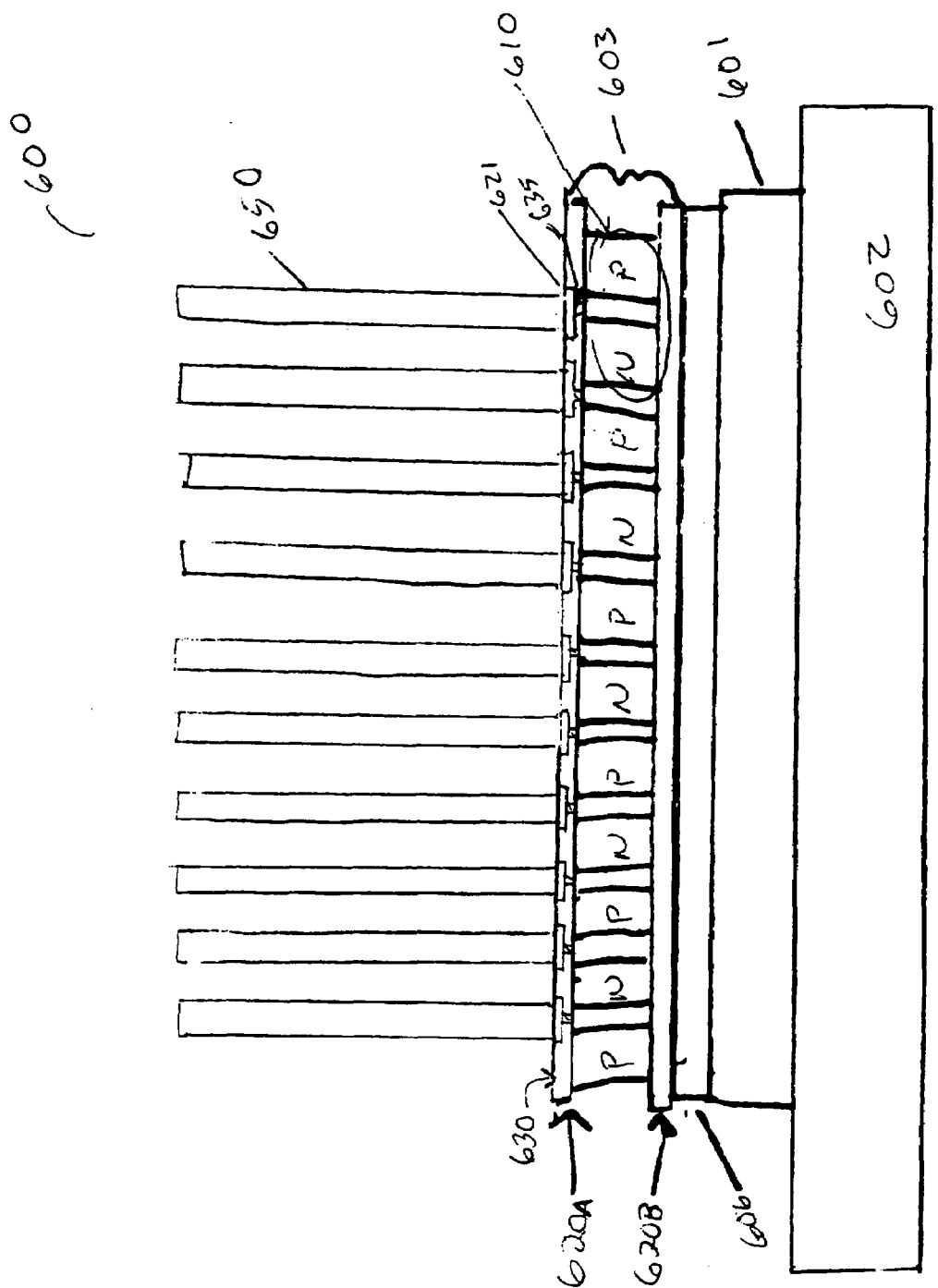
FIG. 6 illustrates a TEM used to cool a microelectronics device in accordance with one embodiment of the invention.

FIG. 6 illustrates a TEM used to cool a microelectronics device in accordance with one embodiment of the invention. TEM-cooled device 600, shown in FIG. 6, includes a device package 601 placed upon a PCB 602. Attached to the device package 601 is a TEM 603 to cool the device package 601. The TEM 603 has an upper substrate 620A and a lower substrate 620B and includes multiple n and p diode pairs 610 disposed between two substrates 620A and 620B. The upper substrate 620A which is the hot side of the TEM 603 has areas 621 of highly thermally conductive material (e.g., copper) integrated into its upper surface 630. The areas 621 are in contact with thermal vias 635 extending through the substrate between the n and p diode pairs. A heat removal device is connected directly to the TEM 603 through the areas 621. For example, as shown, plate fins 650, which may be copper or some other suitable material, are soldered or brazed to areas 621 which also may be copper. For the embodiment illustrated by TEM 600, a TIM layer 606 is disposed between the device package 601 and the TEM substrate 620B, which is the cold side of TEM 603, however for alternative embodiments as discussed below, the TIM layer 606 may also be rendered unnecessary.

ALTERNATIVE EMBODIMENTS

Embodiments of the invention provide a TEM having highly thermally conductive areas integrated into a surface layer of a substrate on the hot side of the TEM, which allow a heat removal device to be attached directly to the TEM. This renders unnecessary a layer of TIM between the TEM and the heat removal device. Embodiments, as discussed above, describe plate fins directly soldered or brazed to metal areas integrated into the surface of the TEM substrate. For alternative embodiments, any heat removal device that can be attached directly to the integrated areas of the highly thermally conductive metal may be used.

Figure 7A:
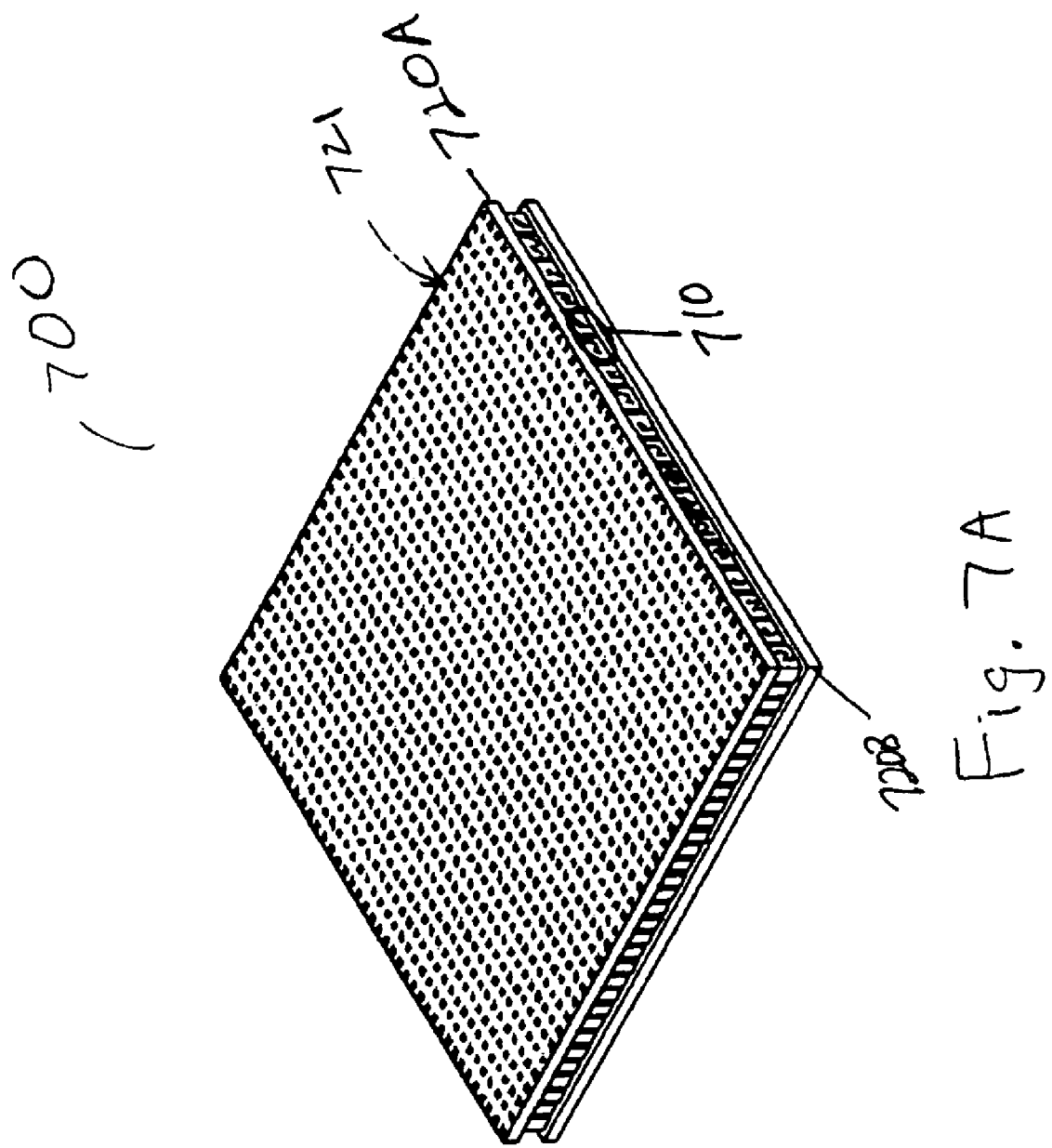
FIG. 7A illustrates a TEM having areas of highly thermally conductive material integrated into a substrate layer in accordance with one embodiment of the invention.
Figure 7B:
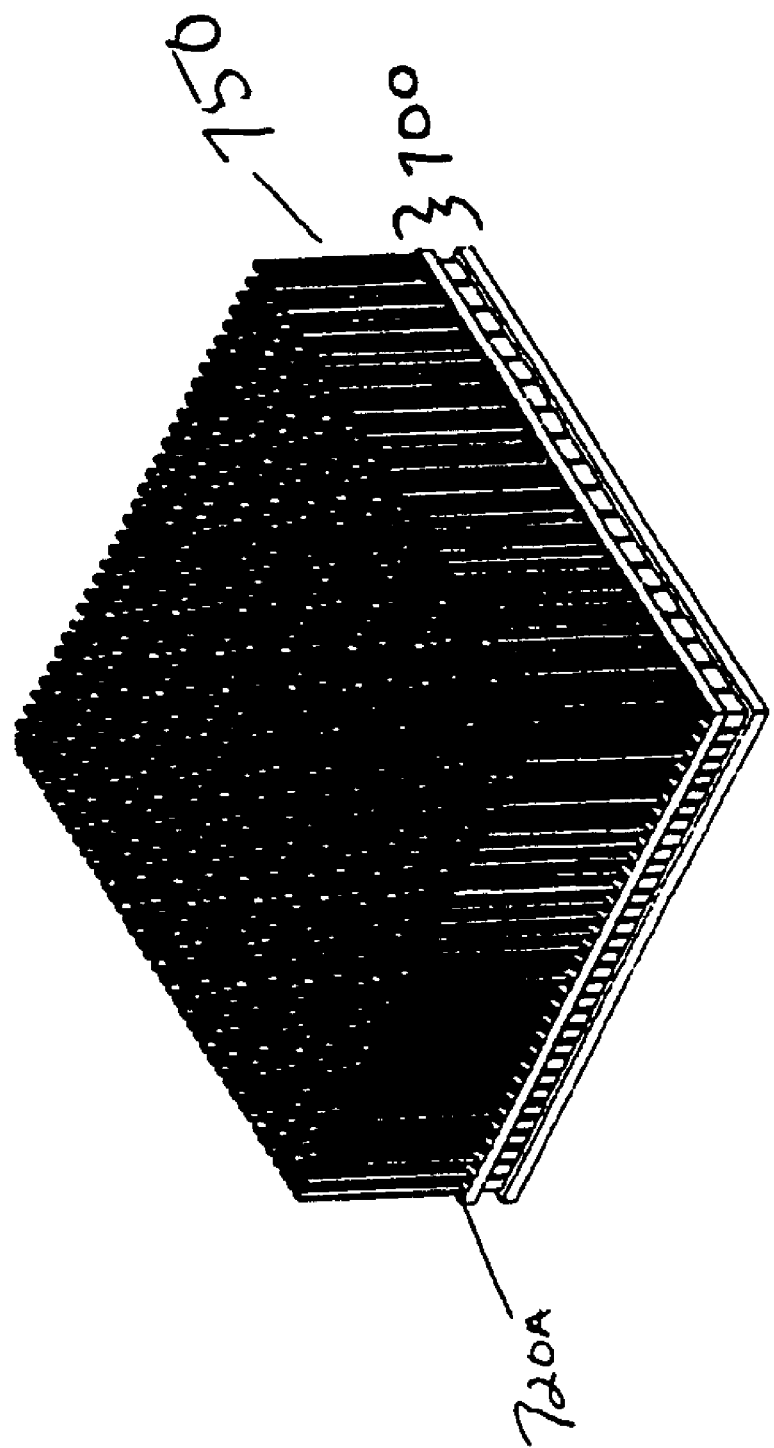
FIG. 7B illustrates a TEM having pads integrated within the surface layer of the substrate and pin fins directly attached to the TEM.

For example, FIG. 7A illustrates a TEM having areas of highly thermally conductive material integrated into a substrate layer in accordance with one embodiment of the invention. TEM 700, shown in FIG. 7A, includes multiple n and p diode pairs 710 disposed between two substrates 720A and 720B. As shown in FIG. 7A, substrate 720A includes integrated pads 721 for directly attaching pin fins. The pads 721 may be copper or aluminum or other highly thermally conductive metals or materials. FIG. 7B illustrates a TEM 700 having pads (not shown) integrated within the surface layer of the substrate and pin fins 750 directly attached to the TEM 700. The pin fins 750 may be soldered or brazed to the pads integrated into the surface layer of the TEM substrate 720A.

For alternative embodiments, coolant-based heat removal devices (e.g., cold plates) can be attached directly to the TEM substrate and used in conjunction with a remote heat exchanger.

While embodiments of the invention discussed above have described a TEM having highly thermally conductive areas integrated into the surface of the substrate of the hot side of the TEM, alternative embodiments may include such areas integrated into the surface of the substrate of the cold side of the TEM, additionally or alternatively. For example, some die packages include a metal exterior surface area. Metal areas integrated into the surface of the substrate of the cold side of the TEM could be directly bonded to the metal surface of the die case. This would render the TIM layer typically used between the die and the TEM unnecessary thus further reducing thermal resistance.

Embodiments of the invention having thermal vias through the substrate have been discussed above with the dimension and position of the thermal vias limited by the electronics of the TEM (e.g., the position of the interconnection of the n and p diode pairs). For alternative embodiments of the invention, the size and position of the thermal vias can be more liberal provided the thermal vias do not extend completely through the substrate of the TEM. For example, for a TEM having a substrate formed from three bonded layers, the layer proximate to the n and p diode pairs may be comprised entirely of an electrically insulating material, while a center layer may have extensive thermal vias formed through it and positioned as desired.

Embodiments of the invention have been discussed in the context of cooling a microelectronic device. It will be apparent to one skilled in the art that various embodiments of the invention may be employed in all applications where a TEM is desired to provide efficient cooling.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A thermoelectric module comprising:
    an upper substrate having an upper internal surface and an upper external surface;
    a lower substrate having a lower internal surface and a lower external surface;
    a plurality of n-diode and p-diode pairs disposed between the lower internal surface and the upper internal surface, electrically connected to effect cooling of the external surface of the lower substrate, wherein the upper external surface has areas of highly thermally conductive material integrated therein; and
    a heat removal device integrated directly to at least one of the areas of highly thermally conductive material into the upper external surface.

2. The thermoelectric module of claim 1 wherein the highly thermally conductive material is a highly thermally conductive metal.

3. The thermoelectric module of claim 2 wherein the highly thermally conductive metal is a metal selected from the group consisting of copper, aluminum, silver, copper-indium, silver-zinc, and multi-layers thereof.

4. The thermoelectric module of claim 1 wherein the heat removal device comprises one or more plate fins.

5. The thermoelectric module of claim 1 wherein the heat removal device comprises a plurality of pin fins.

6. The thermoelectric module of claim 1 wherein the heat removal device is a coolant-based device.

7. A thermoelectric module comprising:
    an upper substrate having an upper internal surface and an upper external surface;
    a lower substrate having a lower internal surface and a lower external surface;
    a plurality of n-diode and p-diode pairs disposed between the lower internal surface and the upper internal surface, electrically connected to effect cooling of the lower external surface, wherein the upper external surface has areas of highly thermally conductive material integrated therein; and
    one or more thermal vias extending from the upper external surface to the upper internal surface.

8. The thermoelectric module of claim 1 wherein the upper external surface has areas of highly thermally conductive material integrated therein.

9. A method comprising:
    providing a microelectronic device;
    attaching a cold side of a thermoelectric module to the microelectronic device to effect cooling of the microelectronic device, the thermoelectric module having areas of highly thermally conductive material integrated into an external surface of a hot side; and
    integrating a heat removal device directly to at least one of the areas of highly thermally conductive material.

10. The method of claim 9 wherein the highly thermally conductive material is a highly thermally conductive metal.

11. The method of claim 10 wherein the highly thermally conductive metal is a metal selected from the group consisting of copper, aluminum, silver, copper-indium, silver-zinc, and multi-layers thereof.

12. The method of claim 11 wherein the heat removal device comprises one or more plate fins.

13. The method claim 11 wherein the heat removal device is a plurality of pin fins.

14. The method of claim 11 wherein the heat removal device is a coolant-based device.

15. The method of claim 9 wherein the thermoelectric module has one or more thermal vias formed through a substrate comprising the hot side of the thermoelectric module.

16. The method of claim 9 wherein one or more thermal vias extend from the external surface of a substrate comprising the hot side of the thermoelectric module to an internal surface of the substrate comprising the hot side of the thermoelectric module.

17. The method of claim 9 wherein the microelectronic device has a metal casing and is bonded directly to areas of highly thermally conductive material integrated into an external surface of the cold side.

18. A system comprising:
    a thermoelectric module having areas of highly thermally conductive material integrated into a substrate comprising a hot side of the thermoelectric module;

a processor mechanically coupled to a substrate comprising a cold side of the thermoelectric module; and a heat removal device directly integrated to at least one of the areas of highly thermally conductive material into the substrate comprising a hot side of the thermoelectric module.

19. The system of claim 18 wherein the highly thermally conductive material is a metal selected from the group consisting of copper, aluminum, silver, copper-indium, silver-zinc, and multi-layers thereof.

20. The system of claim 18 wherein the heat removal device comprises one or more plate fins.

21. The system of claim 18 wherein the heat removal device comprises a plurality of pin fins.

22. The system of claim 18 wherein the heat removal device is a coolant-based device.

23. The system of claim 18 wherein the thermoelectric module has one or more thermal vias formed through the substrate comprising the hot side of the thermoelectric module.

24. The system of claim 18 wherein the processor has a metal casing and is bonded directly to areas of highly thermally conductive material integrated into an external surface of the substrate comprising a cold side of the thermoelectric module.

25. The system of claim 24 wherein the thermoelectric module has one or more thermal vias formed through the substrate comprising the cold side of the thermoelectric module.

26. The thermoelectric module of claim 7 wherein the highly thermally conductive material is a highly thermally conductive metal.

27. The thermoelectric module of claim 7 wherein the highly thermally conductive metal is a metal selected from the group consisting of copper, aluminum, silver, copper-indium, silver-zinc, and multi-layers thereof.

* * * * *